(12) United States Patent
Shindo

(10) Patent No.: US 6,861,030 B2
(45) Date of Patent: Mar. 1, 2005

(54) METHOD OF MANUFACTURING HIGH PURITY ZIRCONIUM AND HAFNIUM

(75) Inventor: Yuichiro Shindo, Ibaraki (JP)

(73) Assignee: Nikko Materials Company, Limited, Tokyo (JP)

( * ) Notice: Subject to any disclaimer, the term of this patent is extended or adjusted under 35 U.S.C. 154(b) by 262 days.

(21) Appl. No.: 10/182,764

(22) PCT Filed: Jun. 29, 2001

(86) PCT No.: PCT/JP01/05612

§ 371 (c)(1),
(2), (4) Date: Jul. 31, 2002

(87) PCT Pub. No.: WO02/29125

PCT Pub. Date: Apr. 11, 2002

(65) Prior Publication Data

US 2003/0062261 A1 Apr. 3, 2003

(30) Foreign Application Priority Data

Oct. 2, 2000 (JP) ........................................ 2000-302392
Nov. 9, 2000 (JP) ........................................ 2000-341301
Mar. 5, 2001 (JP) ........................................ 2000-059769

(51) Int. Cl.[7] .......................... C22C 16/00; C22L 27/00
(52) U.S. Cl. ........................ 420/422; 148/668; 148/772; 148/421
(58) Field of Search ................................ 148/668, 672, 148/421; 420/422; 75/612, 615

(56) References Cited

U.S. PATENT DOCUMENTS

| | | | | |
|---|---|---|---|---|
| 4,108,644 A | * | 8/1978 | Walberg et al. | 75/10.26 |
| 4,722,827 A | * | 2/1988 | Kwon | 420/422 |
| 5,196,916 A | | 3/1993 | Ishigami et al. | 257/769 |
| 6,210,634 B1 | * | 4/2001 | Ishigami et al. | 420/417 |

FOREIGN PATENT DOCUMENTS

| | | |
|---|---|---|
| EP | 0 444 752 A1 | 8/1991 |
| JP | 52-006245 | 1/1977 |
| JP | 02-310331 | 12/1990 |
| JP | 04-350105 | 12/1992 |
| JP | 11-040517 | 2/1999 |

OTHER PUBLICATIONS

Patent Abstracts of Japan, One page English Abstract of JP 11–040517.
Patent Abstracts of Japan, One page English Abstract of JP 04–350105.
Patent Abstracts of Japan, One page English Abstract of JP 02–310331.
Patent Abstracts of Japan, One page English Abstract of JP 52–006245.

* cited by examiner

Primary Examiner—John P. Sheehan
(74) Attorney, Agent, or Firm—Howson and Howson

(57) ABSTRACT

The present invention relates to high-purity zirconium or hafnium with minimal impurities, particularly where the content of alkali metal elements such as Na, K; radioactive elements such as U, Th; transitional metals or heavy metals or high melting point metal elements such as Fe, Ni, Co, Cr, Cu, Mo, Ta, V; and gas components such as C, O, etc. is extremely reduced, as well as to an inexpensive manufacturing method of such high-purity zirconium or hafnium, thereby reducing the impurities hindering the guarantee of the operational performance of semiconductors. The present invention further relates to an inexpensive and safe manufacturing method of high-purity zirconium or hafnium powder from hydrogenated high-purity zirconium or hafnium powder.

20 Claims, No Drawings

METHOD OF MANUFACTURING HIGH PURITY ZIRCONIUM AND HAFNIUM

FIELD OF THE INVENTION

The present invention relates to high-purity zirconium or hafnium with minimal impurities, particularly where the content of alkali metal elements such as Na, K; radioactive elements such as U, Th; transition metals or heavy metals or high melting point metal elements such as Fe, Ni, Co, Cr, Cu, Mo, Ta, V; and gas components such as C, O, etc. is extremely reduced. The present invention further relates to a sputtering target composed of such high-purity zirconium or hafnium, a thin film formed with such target, an inexpensive manufacturing method of high-purity zirconium or hafnium, and an inexpensive and safe manufacturing method of high-purity zirconium or hafnium powder which may be used for the manufacture of such high-purity zirconium or hafnium.

BACKGROUND OF THE INVENTION

Conventionally, a silicon ($SiO_2$) film has been used as the gate oxide film in semiconductor devices. Nevertheless, since the recent trend of semiconductor devices is significantly inclined toward the realization of thinner films and the miniaturization thereof, particularly, if the gate oxide film is made thinner, problems such as insulation resistance, boron penetration, gate leak, gate depletion and the like will arise.

Thus, conventional silicon will be no longer efficient, and a material having a higher dielectric constant than silicon must be employed. As such a material, the use of $ZrO_2$ and $HfO_2$ having a high dielectric constant of roughly 20 and which are difficult to mix with Si may be considered.

Nonetheless, since $ZrO_2$ and $HfO_2$ have a downside in that they easily pass oxidants through and form a interfacial phase with a small dielectric constant during the deposition or in the annealing process thereafter, the use of $ZrSi_2$ and $HfSi_2$ instead of $ZrO_2$ and $HfO_2$ may also be considered.

When using these materials as the gate oxide film or silicide film, the Zr or Hf target or the silicide targets thereof may be formed by performing sputtering under an atmosphere of inert gas such as argon or under a reactive gas atmosphere. Here, Zr and Hf will be the main raw material in either case.

Meanwhile, in order for a material used in the semiconductor device to guarantee the operational performance as a reliable semiconductor, it is essential that impurities harmful to semiconductor devices within the aforementioned materials formed after sputtering be reduced as much as possible.

In other words, (1) alkali metal elements such as Na, K;

(2) radioactive elements such as U, Th;

(3) transition metals or heavy metals or high melting point metal elements such as Fe, Ni, Co, Cr, Cr; and (4) gas component elements such as C, O, N, H must be reduced as much as possible in order to achieve a purity of 4N; that is, 99.99% (parts by weight). Moreover, the %, ppm, ppb used in the present specification all refer to weight %, weight ppm, weight ppb.

Impurities existing in the foregoing semiconductor devices; for instance, alkali metals such as Na, K, transfer easily within the gate insulation film and cause the deterioration of the MOS-LSI boundary characteristics, and radioactive elements such as U, Th cause software errors in devices due to the a ray emitted from such elements. Further, transitional metals or heavy metals or high melting point metal elements such as Fe, Ni, Co, Cr, Cr contained as impurities are known to cause problems in the interface bonding.

Moreover, gas components such as C, O, N, H. which are often disregarded, cause the generation of particles during sputtering, and may be considered as being unfavorable.

A generally available raw material zirconium sponge having a purity level of 3N contains a large quantity of impurities as shown in Table 1; for example, Co: 10 ppm, Cr: 50 ppm, Cu: 10 ppm, Fe: 50 ppm, Mn: 25 ppm, Nb: 50 ppm, Ni: 35 ppm, Ta: 50 ppm, C: 2000 ppm, O: 5000 ppm, N: 200 ppm, etc.

Moreover, a generally available raw material hafnium sponge having a purity level of 2N contains a large quantity of impurities as shown in Table 3, for instance, Cd: 30 ppm, Co: 10 ppm, Cr: 150 ppm, Cu: 50 ppm, Fe: 300 ppm, Mn: 25 ppm, Nb: 30 ppm Ni: 75 ppm, Ta: 100 ppm, O: 500 ppm, N: 60 ppm, etc.

These impurities all hinder the operational performance of semiconductors, and it is necessary to effectively eliminate these impurities harmful to such semiconductor devices.

Nevertheless, there have hardly been any conventional achievements of using zirconium or hafnium as the gate oxide film in a semiconductor device, and, since the refining technology for eliminating such impurities is peculiar and costly, it could be said that no consideration was given to such use of zirconium or hafnium and the use of these materials has been abandoned heretofore.

In addition, although zirconium or hafnium is generally highly purified with electron beam melting, when manufacturing a sputtering target with the aforementioned highly purified zirconium or hafnium as the raw material, it is necessary to manufacture powder of such highly purified zirconium or hafnium.

Thus, an additional process of casting the high-purity zirconium or hafnium obtained with the foregoing electron beam melting into an ingot, and preparing a powder thereafter becomes necessary. The disintegration from an ingot is usually performed with crushing, and, since high-purity zirconium or hafnium powder may ignite and explode, disintegration from an ingot is dangerous. Due to the foregoing reasons, the process of disintegration from an ingot requires sufficient management, and therefore resulted in a problem of increased costs.

OBJECTS OF THE INVENTION

The present invention provides high-purity zirconium or hafnium with minimal impurities, which hinder the guarantee of operational performance of the foregoing semiconductors, particularly where the content of alkali metal elements such as Na, K; radioactive elements such as U, Th; transitional metals or heavy metals or high melting point metal elements such as Fe, Ni, Co, Cr, Cu, Mo, Ta, V; and gas components such as C, O, etc. is extremely reduced, and an inexpensive manufacturing method of such high-purity zirconium or hafnium.

Moreover, the present invention provides a material useful in a zirconium or hafnium sputtering target with minimal gas components capable of effectively reducing the production of particles upon sputtering by suppressing the generation of gas components such as oxygen and carbon.

Furthermore, another object of the present invention is to provide an inexpensive and safe manufacturing method of such high-purity zirconium or hafnium powder employable in the manufacture of the above.

SUMMARY OF THE INVENTION

Accordingly, the present invention provides:

1. High-purity zirconium, a sputtering target composed of the high-purity zirconium, and a thin film formed with the target, characterized in that the content of impurities excluding gas components such as oxygen and carbon is less than 100 ppm;
2. The high-purity zirconium, sputtering target composed of the high-purity zirconium, and thin film formed with the target according to paragraph 1 above, characterized in that the total content of alkali metal elements such as Na and K is 1 ppm or less, the total content of radioactive elements such as U and Th is 5 ppb or less, the total of transitional metals or heavy metals or high melting point metal elements such as Fe, Ni, Co, Cr and Cu excluding Hf is 50 ppm or less, and the remainder thereof is zirconium or other unavoidable impurities;
3. The high-purity zirconium, sputtering target composed of the high-purity zirconium, and thin film formed with the target according to paragraph 1 or paragraph 2 above, characterized in that the content of gas components such as oxygen and carbon is less than 1000 ppm;
4. High-purity hafnium, a sputtering target composed of the high-purity hafnium, and a thin film formed with the target, characterized in that the content of impurities excluding Zr and gas components such as oxygen and carbon is less than 100 ppm;
5. The high-purity hafnium, sputtering target composed of the high-purity hafnium, and thin film formed with the target according to paragraph 4 above, characterized in that the total content of alkali metal elements such as Na and K is 1 ppm or less, the total content of radioactive elements such as U and Th is 5 ppb or less, the total of transitional metals or heavy metals or high melting point metal elements such as Fe, Ni, Co, Cr and Cu excluding Zr is 50 ppm or less, and the remainder thereof is hafnium or other unavoidable impurities;
6. The high-purity hafnium, sputtering target composed of the high-purity hafnium, and thin film formed with the target according to paragraph 4 or paragraph 5 above, characterized in that the content of gas components such as oxygen and carbon is 500 ppm or less; and
7. The high-purity hafnium, sputtering target composed of the high-purity hafnium, and thin film formed with the target according to each of paragraphs 4 to 6 above, characterized in that the content of Zr is 0.5% or less.

Moreover, the present invention further provides:

8. A manufacturing method of high-purity zirconium or hafnium, characterized in that after having eliminated with fluoride nitrate, the surface attachments of a zirconium or hafnium sponge raw material having a level of 2N to 3N, the sponge raw material is made into a compact material by being wrapped with the foil of volatile elements such as Al, Zn, Cu or Mg, and electron beam melting is performed while the compact material is placed in an electron beam melting furnace;
9. The manufacturing method of high-purity zirconium according to paragraph 8 above, characterized in that the content of impurities excluding gas components such as oxygen and carbon is less than 100 ppm;
10. The manufacturing method of high-purity zirconium according to paragraph 9 above, characterized in that the total content of alkali metal elements such as Na and K is 1 ppm or less, the total content of radioactive elements such as U and Th is 5 ppb or less, the total of transitional metals or heavy metals or high melting point metal elements such as Fe, Ni, Co, Cr and Cu excluding Hf is 50 ppm or less, and the remainder thereof is zirconium or other unavoidable impurities;
11. The manufacturing method of high-purity zirconium according to each of paragraphs 8 to 10 above, characterized in that the content of gas components such as oxygen and carbon is less than 1000 ppm;
12. The manufacturing method of high-purity hafnium according to paragraph 8 above, characterized in that the content of impurities excluding Zr and gas components such as oxygen and carbon is less than 100 ppm;
13. The manufacturing method of high-purity hafnium according to paragraph 8 or paragraph 12 above, characterized in that the total content of alkali metal elements such as Na and K is 1 ppm or less, the total content of radioactive elements such as U and Th is 5 ppb or less, the total of transitional metals or heavy metals or high melting point metal elements such as Fe, Ni, Co, Cr and Cu excluding Hf is 50 ppm or less, and the remainder thereof is hafnium or other unavoidable impurities;
14. The manufacturing method of high-purity hafnium according to each of paragraphs 8, 12 or 13 above, characterized in that the content of gas components such as oxygen and carbon is less than 500 ppm; and
15. The manufacturing method of high-purity hafnium according to each of paragraphs 8, or paragraphs 12 to 14 above, characterized in that the content of Zr is 0.5% or less.

Moreover, the present invention further provides:

16. A manufacturing method of high-purity zirconium powder or hafnium powder, characterized in comprising the step of highly purifying a zirconium or hafnium raw material by performing electron beam melting thereto and preparing an ingot thereby; the step of cutting the obtained high-purity zirconium or hafnium ingot and heating the acid-cleansed swarf or the like to 500° C. or more under a hydrogen atmosphere for hydrogenation; the step of obtaining hydrogenated high-purity zirconium or hafnium powder by cooling the ingot and flaking the hydrogenated zirconium or hafnium powder from the ingot; and the step of eliminating the hydrogen of the hydrogenated high-purity zirconium or hafnium powder;
17. A manufacturing method of high-purity zirconium or hafnium powder according to paragraph 16 above, characterized in that the hydrogenation is performed by applying heat to a temperature of 700° C. or more under a hydrogen atmosphere;
18. A manufacturing method of high-purity zirconium or hafnium powder according to paragraph 16 or paragraph 17 above, characterized in that inert gas such as argon is introduced during the cooling;
19. A manufacturing method of high-purity zirconium or hafnium powder according to each of paragraphs 16 to 18 above, characterized in that hydrogenated high-purity zirconium or hafnium powder is obtained by cooling the ingot or swarf to 500° C. or less;
20. A manufacturing method of high-purity zirconium or hafnium powder according to each of paragraphs 16 to 19 above, characterized in that the high-purity zirconium or hafnium powder flaked from the ingot is further pulverized;

21. A manufacturing method of high-purity zirconium or hafnium powder according to each of paragraphs 16 to 20 above, characterized in that the hydrogen is eliminated by applying heat in a vacuum or under an inert atmosphere; and
22. A manufacturing method of high-purity zirconium powder according to each of paragraphs 16 to 21 above, characterized in that the content of, impurities excluding gas components such as oxygen and carbon is less than 100 ppm.

Moreover, the present invention further provides:

23. A manufacturing method of high-purity zirconium powder according to each of paragraphs 16 to 22 above, characterized in that the total content of alkali metal elements such as Na and K is 1 ppm or less, the total content of radioactive elements such as U and Th is 5 ppb or less, the total of transitional metals or heavy metals or high melting point metal elements such as Fe, Ni, Co, Cr and Cu excluding Hf is 50 ppm or less, and the remainder thereof is zirconium or other unavoidable impurities;
24. A manufacturing method of high-purity hafnium powder according to each of paragraphs 16 to 21 above, characterized in that the content of zirconium and impurities excluding gas components such as oxygen and carbon is less than 100 ppm;
25. A manufacturing method of high-purity hafnium powder according to paragraph 24 above, characterized in that the total content of alkali metal elements such as Na and K is 1 ppm or less, the total content of radioactive elements such as U and Th is 5 ppb or less, the total of transitional metals or heavy metals or high melting point metal elements such as Fe, Ni, Co, Cr and Cu excluding Zr is 50 ppm or less, and the remainder thereof is hafnium or other unavoidable Impurities; and
26. A manufacturing method of high-purity hafnium powder according to paragraph 24 or paragraph 25 above, characterized in that the content of zirconium is 0.5% or less.

DETAILED DESCRIPTION OF THE PREFERRED EMBODIMENTS

With respect to the present invention, high-purity zirconium or hafnium and the manufacturing method thereof are foremost explained.

A commercially available zirconium or hafnium sponge raw material having a level of 2N to 3N will be used. Since a large quantity of contaminants such as organic matter (which will cause the increase of impurity C) and inorganic matter is attached to the surface thereof, such contaminants are eliminated with fluoride nitride, which has a powerful cleansing effect.

In order to enable electron beam melting after having cleansed the surface of the sponge, such sponge raw material is usually made into a compact through compression with a press. Here, since the zirconium or hafnium sponge raw material is extremely fragile, there is a problem in that such material will fall apart and crumble.

Therefore, the sponge is wrapped with the foil of volatile elements such as Al, Zn, Cu or Mg to form a compact material. This compact material is placed in an electron beam melting furnace and electron beam melting is performed thereto.

Since electron beam melting is performed in a vacuum, the foregoing volatile metal elements will be volatilized and eliminated together with gas components, molten metals or other floating impurities immediately after the melting, and will therefore not become a contaminant.

Pursuant to the refining with electron beam melting, high-purity zirconium wherein the content of impurities excluding gas components such as oxygen and carbon Is less than 100 ppm, or high-purity hafnium wherein the content of Zr and impurities excluding gas components is less than 100 ppm can be obtained. In other words, high-purity zirconium and high-purity hafnium of 4N (99.99%) can be manufactured.

Moreover, although a large quantity of hafnium is contained in zirconium, and a large quantity of zirconium is contained in hafnium, and notwithstanding the fact that the separation and refinement between the two is difficult, this may be disregarded since the purpose of use of the respective materials will not hinder the overall purpose hereof.

As described above, with the high-purity zirconium, impurities which will deteriorate the performance of semiconductor materials; in other words, the total content of alkali metal elements such as Na and K will be 1 ppm or less, the total content of radioactive elements such as U and Th will be 5 ppb or less, and the total of transitional metals or heavy metals or high melting point metal elements such as Fe, Ni, Co, Cr and Cu excluding Hf will be 50 ppm or less, thereby enabling the reduction of such impurities to fall below a problematic level.

Although it is difficult to reduce the content of gas components such as oxygen and carbon, it is still possible to obtain high-purity zirconium having a content of gas components considerably lower in comparison to the raw material, that is to be less than 1000 ppm.

Further, the same could be said for high-purity hafnium, and it is possible to obtain high-purity hafnium wherein the total content of alkali metal elements such as Na and K will be 1 ppm or less, the total content of radioactive elements such as U and Th will be 5 ppb or less, the total of transitional metals or heavy metals for high melting point metal elements such as Fe, Ni, Co, Cr and Cu excluding Hf will be 50 ppm or less, and the remainder thereof will be hafnium or other unavoidable impurities. Here, the content of gas components such as oxygen and carbon can be reduced to 500 ppm or less.

It is extremely, difficult to reduce Zr in high-purity, hafnium. Nevertheless, the content thereof can be reduced to 0.5% or less. Moreover, the fact that Zr is mixed in high-purity hafnium will not aggravate the properties of semiconductors, and will not be a problem.

EXAMPLES

Next, the present invention is explained based on the Examples relating to high-purity zirconium or hafnium and the manufacturing methods thereof. The Examples are for facilitating the understanding of the invention, and the present invention shall in no way be limited thereby. In other words, the present invention includes other examples and modifications based on the technical spirit of the invention.

Example 1

The raw material zirconium sponge having the purity level (3N level) shown in Table 1 was cleansed with fluoride nitrate, impurities attached to the surface thereof were eliminated, and this was wrapped with Zn foil in order to obtain a compact.

Next, this compact was introduced into an electron beam melting furnace, and electron beam melting was performed thereto. Conditions of the electron beam melting at such time were as follows:

Degree of vacuum: $2 \times 10^{-4}$ Torr

Current: 1.25 A

Casting speed: 20 kg/hr

Powers source unit: 4 kwh/kg

Impurity analysis of the high-purity zirconium obtained as a result of the above is shown in Table 2.

TABLE 1

| Element | Al | B | Cd | Co | Cr |
|---|---|---|---|---|---|
| ppm | 20 | 0.25 | 0.25 | 10 | 50 |
| Element | Cu | Fe | Hf | Mn | Mo |
| ppm | 10 | 50 | 66 | 25 | 10 |
| Element | Nb | Ni | P | Pb | Si |
| ppm | 50 | 35 | 3 | 25 | 10 |
| Element | Sn | Ta | Ti | U | Th |
| ppm | 10 | 50 | 25 | 1 | — |
| Element | V | W | C | H | N |
| ppm | 25 | 25 | 2000 | 140 | 200 |
| Element | O | | | | |
| ppm | 5000 | | | | | ppm (parts by weight)

TABLE 2

| Element | Al | B | Cd | Co | Cr |
|---|---|---|---|---|---|
| % | 0.3 | <0.1 | <0.1 | <0.1 | <0.1 |
| Element | Cu | Fe | Hf | Mn | Mo |
| % | 1.7 | 13 | 27 | <0.1 | <0.5 |
| Element | Nb | Ni | P | Pb | Si |
| % | <0.1 | 2.9 | 0.1 | <0.1 | 1.0 |
| Element | Sn | Ta | Ti | U | Th |
| % | 0.2 | <5 | — | 0.7 | 0.5 |
| Element | V | W | C | H | N |
| % | 0.1 | <0.1 | 170 | <10 | <20 |
| Element | O | | | | |
| % | 530 | | | | |

U, Th: ppb (parts by weight),
Others: ppm (parts by weight)

As shown in Table 2, as a result of the zirconium sponge having the purity level (3N level) shown in Table 1 being cleansed with fluoride nitrate and subject to electron beam melting, the content of impurities excluding gas components such as oxygen and carbon became less than 100 ppm, and high-purity zirconium having a 4N (99.99%) level was obtained thereby.

Particularly, obtained was high-purity zirconium wherein the total content of alkali metal elements such as Na and K is 1 ppm or less, the total content of radioactive elements such as U and Th is 5 ppb or less, the total of transitional metals or heavy metals or high melting point metal elements such as Fe, Ni, Co, Cr and Cu excluding Hf is 50 ppm or less, and the remainder thereof is zirconium or other unavoidable impurities.

Moreover, with respect to other impurities not indicated in Table 2, most of such impurities were less than 0.1 ppm.

As shown in Table 2 above, the hafnium contained in zirconium is generally of a high concentration, but the hafnium was reduced to half of the raw material; that is, to 27 ppm.

Further, oxygen: 530 ppm, carbon: 170 ppm, N: 20 ppm, H: 10 ppm, and the total content of these gas components was less than 1000 ppm, and thereby obtained was high-purity zirconium with minimal gas components.

As described above, the zirconium sponge compact was wrapped with Zn foil and introduced into the melting furnace upon performing electron beam melting, and, although the Zn foil volatized during the electron beam melting, the amount contained in zirconium was less than 0.1 ppm, and this mixed amount is not an amount that will cause problems as an impurity.

In addition, although an attempt was made to prepare a compact with only the zirconium sponge by packing such sponge with a press without wrapping it with a foil of Zn or the like, a compact could not be obtained since the sponge fell apart and crumbled during the pressing process. Therefore, the preparation of the compact by wrapping it with a foil of a volatile element such as Al, Zn, Cu or Mg is a necessary and preferable condition for preparing the aforementioned high-purity zirconium.

Example 2

The raw material hafnium sponge having the purity level (2N level) shown in Table 3 was cleansed with fluoride nitrate as with Example 1, impurities attached to the surface thereof were eliminated, and this was wrapped with Zn foil in order to obtain a compact.

Next, this compact was introduced into an electron beam melting furnace, and electron beam melting was performed thereto. Conditions of the electron beam melting at such time were as follows:

Degree of vacuum: $2 \times 10^{-4}$ Torr

Current: 1.25 A

Casting speed: 20 kg/hr

Powers source unit: 4 kwh/kg

Impurity analysis of the high-purity hafnium obtained as a result of the above is shown in Table 4.

TABLE 3

| Element | Al | B | Cd | Co | Cr |
|---|---|---|---|---|---|
| ppm | 30 | 5 | 30 | 10 | 150 |
| Element | Cu | Fe | Zr | Mn | Mo |
| ppm | 50 | 300 | 25000 | 25 | 10 |
| Element | Nb | Ni | P | Pb | Si |
| ppm | 30 | 75 | 10 | 20 | 100 |
| Element | Sn | Ta | Ti | U | Th |
| ppm | 10 | 100 | 75 | — | — |
| Element | V | W | C | H | N |
| ppm | 10 | 25 | 75 | — | 60 |
| Element | O | | | | |
| ppm | 500 | | | | | ppm (parts by weight)

TABLE 4

| Element | Al | B | Cd | Co | Cr |
|---|---|---|---|---|---|
| % | <0.1 | <0.1 | <0.1 | <0.1 | <0.1 |
| Element | Cu | Fe | Zr | Mn | Mo |
| % | <0.1 | <0.1 | 3500 | <0.1 | <0.5 |
| Element | Nb | Ni | P | Pb | Si |
| % | 0.1 | <0.1 | 0.4 | <0.1 | 1.0 |
| Element | Sn | Ta | Ti | U | Th |
| % | <0.1 | <5 | <0.1 | 0.6 | <0.1 |
| Element | V | W | C | H | N |
| % | <0.1 | <0.1 | 30 | <10 | <10 |
| Element | O | | | | |
| % | 120 | | | | |

U, Th: ppb (parts by weight),
Others: ppm (parts by weight)

As shown in Table 4, as a result of the hafnium sponge having the purity level (2N level) shown in Table 3 being cleansed with fluoride nitrate and subject to electron beam melting, the content of zirconium and impurities excluding gas components such as oxygen and carbon became less than 100 ppm, and high-purity hafnium having a 4N (99.99%) level excluding zirconium and gas components such as oxygen and carbon was obtained thereby.

Particularly, obtained was high-purity hafnium wherein the total content of alkali metal elements such as Na and K is 1 ppm or less, the total content of radioactive elements such as U and Th is 5 ppb or less, the total of transitional metals or heavy metals or high melting point metal elements such as Fe, Ni, Co, Cr and Cu excluding Hf is 50 ppm or less, and the remainder thereof is hafnium or other unavoidable impurities. With respect to other impurities not indicated in Table 4, most of such impurities were less than 0.1 ppm.

Further, oxygen: 120 ppm, carbon: 30 ppm, N: less than 10 ppm, H: less than 10 ppm, and the total content of these gas components was less than 500 ppm, and thereby obtained was high-purity hafnium with minimal gas components.

As described above, the hafnium sponge compact was wrapped with Zn foil and introduced into the melting furnace upon performing electron beam melting, and, although the Zn foil volatized during the electron beam melting, the amount contained in zirconium was less than 0.1 ppm, and this mixed amount is not an amount that will cause problems as an impurity.

In addition, although an attempt was made to prepare a compact with only the hafnium sponge by packing such sponge with a press without wrapping it with a foil of Zn or the like, a compact could not be obtained since the sponge fell apart and crumbled during the pressing process. Therefore, the preparation of the compact by wrapping it with a foil of a volatile element such as Al, Zn, Cu or Mg is a necessary and preferable condition for preparing the aforementioned high-purity hafnium.

As shown in Table 4 above, the zirconium contained in hafnium is generally of a high concentration, but the zirconium was reduced to approximately 1/7 of the raw material; that is, to 3500 ppm.

Next, the manufacturing method of high-purity zirconium or hafnium powder according to the present invention will be explained.

The high-purity zirconium or hafnium capable of being obtained with the step of highly purifying a zirconium or hafnium raw material by performing electron beam melting thereto and preparing an ingot thereby according to the present invention may be manufactured with the electron beam melting refinement in the foregoing best mode for carrying out the invention (Embodiment 1).

As described above, zirconium or hafnium subject to electron beam melting and highly purified is formed as an ingot by being cast in an ingot, this high-purity zirconium or hafnium is made into an ingot or swarf to enlarge the surface area and acid cleansed thereby, and this is hydrogenated by applying heat to a temperature of 500° C. or more under a hydrogen atmosphere. This is an important step upon obtaining fine powder of zirconium or hafnium.

Upon hydrogenation, as described above, the ingot or swarf is placed in a furnace under a hydrogen atmosphere or in an atmospheric current and heated to 500° C. or more. The zirconium or hafnium ingot begins to hydrogenate from around 500° C., and hydrogenation begins to progress rapidly when reaching a temperature of 700° C. A large quantity thereof will hydrogenate when retained in this furnace temperature for 10 minutes or more.

When cooling this to a temperature of 500° C. or less, hydrogenated zirconium or hafnium will begin to flake (peel) from the surface of the ingot. It is desirable that the atmosphere in the cooling furnace be an inert gas atmosphere such as an argon atmosphere. If hydrogenation is insufficient, hydrogenation can easily be achieved by repeating the foregoing processes.

Although some of the flaked materials are disintegrated in a powder form as is, those having a thin flake shape may be pulverized as required to obtain fine hydrogenated zirconium or hafnium powder.

The fine hydrogenated zirconium or hafnium powder obtained according to the above does not possess dangers of ignition or explosion as with independent zirconium or hafnium powder, and yields a significant effect in that it may be manufactured stably and with ease. Further, since the disintegration process is conducted in a reducing (hydrogen) atmosphere, there is an advantage in that the oxidization of ingot and oxidization of powder can be prevented.

Moreover, although hydrogenated zirconium or hafnium powder may be used as this hydrogenated powder in accordance with the usage thereof, when dehydrogenation is required, the application of heat in a vacuum or under an inert gas atmosphere will easily eliminate the hydrogen. Thereby, external contamination and oxidization can be prevented, and this yields a superior characteristic in that high-purity zirconium or hafnium powder can be easily obtained.

EXAMPLES

Next, the manufacturing method of high-purity zirconium or hafnium powder according to the present invention is explained based on the Examples. These Examples are also for facilitating the understanding of the invention, and the present invention shall in no way be limited thereby. In other words, the present invention includes other examples and modifications based on the technical spirit of the invention.

Example 1

The raw material zirconium sponge having the purity level (3N level) shown in Table 1 was cleansed with fluoride nitrate, impurities attached to the surface thereof were eliminated, and this was wrapped with Zn foil in order to obtain a compact. Only the principle impurities of the raw material zirconium sponge are indicated in Table 1.

Next, this compact was introduced into an electron beam melting furnace, and electron beam melting was performed thereto. Conditions of the electron beam melting at such time were as follows:

Degree of vacuum: $2 \times 10^{-4}$ Torr

Current: 1.25 A

Casting speed: 20 kg/hr

TABLE 1

| Element | ppm | Element | ppm | Element | ppm |
|---------|-----|---------|-----|---------|-----|
| Al | 20 | Mo | 10 | U | 1 |
| B | 0.25 | Nb | 50 | Th | — |
| Cd | 0.25 | Ni | 35 | V | 25 |
| Co | 10 | P | 3 | W | 25 |
| Cr | 50 | Pb | 25 | C | 2000 |
| Cu | 10 | Si | 10 | H | 140 |
| Fe | 50 | Sn | 10 | N | 200 |
| Hf | 66 | Ta | 50 | O | 5000 |
| Mn | 25 | Ti | 25 | | | ppm (parts by weight)

After electron beam melting, the result was cast to obtain a high-purity zirconium ingot. Upon performing electron beam melting, although the Zn foil volatized during the electron beam melting, the amount contained in zirconium was less than 0.1 ppm, and this mixed amount is not an amount that will cause problems as an impurity.

In addition, although an attempt was made to prepare a compact with only the zirconium sponge by packing such sponge with a press without wrapping it with a foil of Zn or the like, a compact could not be obtained since the sponge fell apart and crumbled during the pressing process. Therefore, the preparation of the compact by wrapping it with a foil of a volatile element such as Al, Zn, Cu or Mg is a necessary and preferable condition for preparing the aforementioned high-purity zirconium.

Next, 1 kg worth was removed from this high-purity zirconium ingot and placed in a hydrogen atmosphere furnace, retained for 30 minutes at 800° C. in a hydrogen current, and cooled thereafter. Hydrogen was replaced with argon upon the temperature reaching 400° C. pursuant to the cooling, and the ingot was removed upon cooling this to room temperature.

As a result, 30% of the ingot; that is, 300 g of hydrogenated zirconium powder was obtained. Thereafter, upon having performed the same process for the un-hydrogenated zirconium, zirconium powder in which the remaining portion hydrogenated completely was obtained. Portions that did not disintegrate were pulverized, and such portions were easily made into powder.

Further, there was no fear of ignition or explosion during the manufacture process of this hydrogenated zirconium powder, and operations could be safely conducted. Moreover, zirconium powder could easily be obtained by heating the hydrogenated zirconium in a vacuum or under an inert gas atmosphere such as an argon atmosphere.

Impurity analysis of the high-purity zirconium obtained as a result of the above is shown in Table 2.

TABLE 2

| Element | Content | Element | Content | Element | Content |
|---|---|---|---|---|---|
| Li | <0.005 | As | 0.06 | Sm | <0.005 |
| Be | <0.005 | Se | <0.05 | Eu | <0.005 |
| B | 0.06 | Br | <0.05 | Gd | <0.005 |
| F | <0.05 | Rb | <0.05 | Tb | <0.005 |
| Na | <0.01 | Sr | <0.05 | Dy | <0.005 |
| Mg | <0.005 | Y | <0.05 | Ho | <0.005 |
| Al | 0.73 | Zr | Matrix | Er | <0.005 |
| Si | 1.2 | Nb | <0.1 | Tm | <0.005 |
| P | 0.17 | Mo | 0.22 | Yb | <0.005 |
| S | 0.35 | Ru | <0.05 | Lu | <0.005 |
| Cl | 0.01 | Rh | <0.01 | Hf | 56 |
| K | <0.01 | Pd | <0.1 | Ta | <5 |
| Ca | <0.05 | Ag | <0.1 | W | 0.03 |
| Sc | <5 | Cd | <0.1 | Re | <0.005 |
| Ti | 0.93 | In | <0.05 | Os | <0.005 |
| V | 0.28 | Sn | <0.05 | Ir | 0.06 |
| Cr | 0.04 | Sb | <0.05 | Pt | <0.05 |
| Mn | <0.005 | Te | <0.05 | Au | <0.05 |
| Fe | 17 | I | <0.1 | Hg | <0.05 |
| Co | 2.3 | Cs | <0.005 | Tl | <0.01 |
| Ni | 3.6 | Ba | <0.005 | Pb | <0.005 |
| Cu | 0.3 | La | <0.005 | Bi | <0.005 |
| Zn | 0.05 | Ce | <0.005 | Th | <0.001 |
| Ga | <0.01 | Pr | <0.005 | U | <0.001 |
| Ge | <0.05 | Nd | <0.005 | | | ppm (parts by weight)

Thereby, the content of impurities excluding gas components such as oxygen and carbon became less than 100 ppm, and high-purity zirconium powder having a 4N (99.99%) level was obtained thereby.

Particularly, obtained was high-purity zirconium powder wherein the total content of alkali metal elements such as Na and K is 1 ppm or less, the total content of radioactive elements such as U and Th is 5 ppb or less, the total of transitional metals or heavy metals or high melting point metal elements such as Fe, Ni, Co, Cr and Cu excluding Hf is 50 ppm or less, and the remainder thereof is zirconium or other unavoidable impurities.

Moreover, with respect to other impurities not indicated in Table 2, most of such impurities were less than 0.1 ppm.

Example 2

The raw material hafnium sponge having the purity level (2N level) shown in Table 3 was cleansed with fluoride nitrate as with Example 1, impurities attached to the surface thereof were eliminated, and this was wrapped with Zn foil in order to obtain a compact.

Next, this compact was introduced into an electron beam melting furnace, and electron beam melting was performed thereto. Conditions of the electron beam melting at such time were as follows:

Degree of vacuum: $2 \times 10^{-4}$ Torr

Current: 1.25 A

Casting speed: 20 kg/hr

Powers source unit: 4 kwh/kg

Impurity analysis of the high-purity hafnium obtained as a result of the above is shown in Table 4.

TABLE 3

| Element | ppm | Element | ppm | Element | ppm |
|---|---|---|---|---|---|
| Al | 30 | Mo | 10 | U | — |
| B | 5 | Nb | 30 | Th | — |
| Cd | 30 | Ni | 75 | V | 10 |
| Co | 10 | P | 10 | W | 25 |
| Cr | 150 | Pb | 20 | C | 75 |
| Cu | 50 | Si | 100 | H | — |
| Fe | 300 | Sn | 10 | N | 60 |
| Zr | 25000 | Ta | 100 | O | 500 |
| Mn | 25 | Ti | 75 | | | ppm (parts by weight)

After electron beam melting, the result was cast to obtain a high-purity hafnium ingot. Upon performing electron beam melting, although the Zn foil volatized during the electron beam melting was with Example 1, the amount contained in hafnium was less than 0.1 ppm, and this mixed amount is not an amount that will cause problems as an impurity.

Next, 1 kg worth was removed from this high-purity hafnium ingot and placed in a hydrogen atmosphere furnace, retained for 30 minutes at 800° C. in a hydrogen current, and cooled thereafter. Hydrogen was replaced with argon upon the temperature reaching 400° C. pursuant to the cooling, and the ingot was removed upon cooling this to room temperature.

As a result, 30% of the ingot; that is, 300 g of hydrogenated hafnium powder was obtained. Thereafter, upon having performed the same process for the un-hydrogenated hafnium, and hafnium powder in which the remaining portion hydrogenated completely was obtained. Portions that did not result as powder were pulverized, and such portions were easily made into powder.

Further, there was no fear of ignition or explosion during the manufacture process of this hydrogenated hafnium powder, and operations could be safely conducted. Moreover, hafnium powder could easily be obtained by heating the hydrogenated hafnium in a vacuum or under an inert gas atmosphere such as argon gas.

Impurity analysis of the high-purity hafnium obtained as a result of the above is shown in Table 2.

TABLE 4

| Element | Content | Element | Content | Element | Content |
|---|---|---|---|---|---|
| Li | <0.001 | As | 0.005 | Sm | <0.001 |
| Be | <0.001 | Se | <0.01 | Eu | <0.001 |
| B | 0.009 | Br | <0.01 | Gd | <0.001 |
| F | <0.05 | Rb | <0.001 | Tb | <0.001 |
| Na | 0.15 | Sr | 0.04 | Dy | <0.001 |
| Mg | 0.002 | Y | <0.01 | Ho | <0.001 |
| Al | 0.40 | Zr | 2400 | Er | <0.001 |
| Si | 0.32 | Nb | 0.025 | Tm | <0.001 |
| P | 0.05 | Mo | 0.06 | Yb | <0.005 |
| S | 0.49 | Ru | <0.005 | Lu | <0.05 |
| Cl | 0.03 | Rh | <0.005 | Hf | Matrix |
| K | <0.01 | Pd | <0.01 | Ta | <2 |
| Ca | <0.01 | Ag | <0.05 | W | <0.01 |
| Sc | 0.16 | Cd | <0.01 | Re | <0.005 |
| Ti | 11 | In | 0.07 | Os | <0.02 |
| V | 0.21 | Sn | <0.01 | Ir | <0.5 |
| Cr | 1.6 | Sb | <0.005 | Pt | <0.5 |
| Mn | 0.01 | Te | <0.01 | Au | <0.5 |
| Fe | 1.4 | I | <0.005 | Hg | <0.05 |
| Co | 0.08 | Cs | <0.005 | Tl | <0.005 |
| Ni | 0.38 | Ba | <0.005 | Pb | <0.005 |
| Cu | <0.005 | La | <0.001 | Bi | 0.02 |
| Zn | <0.005 | Ce | <0.001 | Th | <0.0005 |
| Ga | 0.06 | Pr | <0.001 | U | 0.0005 |
| Ge | <0.01 | Nd | <0.001 | | |

Content: ppm (parts by weight)

Incidentally, this analysis shows only the principle impurities. The other impurities had contents approximate to the zirconium content.

As shown in Table 4, as a result of the hafnium sponge having the purity level (2N level) shown in Table 3 being cleansed with fluoride nitrate and subject to electron beam melting, the content of zirconium and impurities excluding gas components such as oxygen and carbon became less than 100 ppm, and high-purity zirconium having a 4N (99.99%) level excluding zirconium and gas components such as oxygen and carbon was obtained thereby.

Particularly, obtained was high-purity hafnium wherein the total content of alkali metal elements such as Na and K is 1 ppm or less, the total content of radioactive elements such as U and Th is 5 ppb or less, the total of transitional metals or heavy metals for high melting point metal elements such as Fe, Ni, Co, Cr and Cu excluding Hf is 50 ppm or less, and the remainder thereof is hafnium or other unavoidable impurities. With respect to other impurities not indicated in Table 4, most of such impurities were less than 0.1 ppm.

Example 3

The zirconium ingot manufactured similarly with Example 1 was cut with a lathe, cleaned with fluoride nitrate, and thereafter hydrogenated under the same conditions. Powder could easily be obtained thereby. The analysis was approximate to Table 2.

A superior effect is yielded in that high-purity zirconium or high-purity hafnium with minimal impurities, particularly where the content of alkali metal elements such as Na, K; radioactive elements such as U, Th; transitional metals or heavy metals or high melting point metal elements such as Fe, Ni, Co, Cr, Cu, Mo, Ta, V; and gas components such as C, O, etc. is extremely reduced, can be manufactured inexpensively pursuant to electron beam melting.

Moreover, there is a significant characteristic in that a zirconium or hafnium sputtering target with minimal gas components capable of suppressing the production of gas components such as oxygen and carbon and effectively reducing the generation of particles during sputtering can be obtained, and that a material useful in the manufacture of a gate oxide film or the like in semiconductor devices can be obtained. Further, there is another superior effect in that powder which can be used in the manufacture of the foregoing high-purity zirconium or hafnium can be manufactured inexpensively while preventing dangers such as ignition and explosion.

What is claimed is:

1. A method of manufacturing high-purity zirconium, comprising the steps of:

providing a zirconium sponge raw material having a level of 2N to 3N, cleansing the sponge raw material with fluoride nitrate to eliminate surface attachments on the sponge raw material, wrapping the sponge raw material with a foil made of at least one volatile element including at least one of Al, Zn, Cu and Mg after said cleansing step, forming the foil-wrapped sponge raw material into a compact material, and electron beam melting the compact material after the compact material is placed in an electron beam melting furnace.

2. The method according to claim 1, wherein, after said electron beam melting step, the compact material has a content of less than 100 ppm of impurities excluding gas components which include oxygen and carbon.

3. The method according to claim 2, wherein, after said electron beam melting step, the compact material has a total content of alkali metal elements including Na and K of 1 ppm or less, a total content of radioactive elements including U and Th of 5 ppb or less, a total content of transitional metals, heavy metals and high melting point metal elements including Fe, Ni, Co, Cr and Cu and excluding Hf of 50 ppm or less, and a remainder thereof of zirconium and other unavoidable impurities.

4. A method according to claim 1, wherein, after said electron beam melting step, the compact material has a content of gas components including oxygen and carbon of less than 1000 ppm.

5. A method according to claim 2, wherein, after said electron beam melting step, the compact material has a content of gas components including oxygen and carbon of less than 1000 ppm.

6. A method according to claim 3, wherein, after said electron beam melting step, the compact material has a content of gas components including oxygen and carbon of less than 1000 ppm.

7. A method of manufacturing high-purity hafnium, comprising the steps of:

providing a hafnium sponge raw material having a level of 2N to 3N, cleansing the sponge raw material with fluoride nitrate to eliminate surface attachments on the sponge raw material, wrapping the sponge raw material in a foil made of at least one volatile element including at least one of Al, Zn, Cu and Mg after said cleansing step, forming the foil-wrapped sponge raw material into a compact material, and electron beam melting the compact material after the compact material is placed in an electron beam melting furnace.

8. The method according claim 7, wherein, after said electron beam melting step, the compact material has a content of less than 100 ppm of impurities excluding Zr and gas components which include oxygen and carbon.

9. The method according to claim 7, wherein, after said electron beam melting step, the compact material has a total content of alkali metal elements including Na and K of 1 ppm or less, a total content of radioactive elements including U and Th of 5 ppb or less, a total content of transitional metals, heavy metals and high melting point metal elements including Fe, Ni, Co, Cr and Cu and excluding Zr of 50 ppm or less, and a remainder thereof of hafnium and other unavoidable impurities.

10. The method according to claim 8, wherein, after said electron beam melting step, the compact material has a total content of alkali metal elements including Na and K of 1 ppm or less, a total content of radioactive elements including U and Th of 5 ppb or less, a total content of transitional metals, heavy metals and high melting point metal elements including Fe, Ni, Co, Cr and Cu and excluding Zr of 50 ppm or less, and a remainder thereof of hafnium and other unavoidable impurities.

11. A method according to claim 7, wherein, after said electron beam melting step, the compact material has a content of gas components including oxygen and carbon of less than 500 ppm.

12. A method according to claim 8, wherein, after said electron beam melting step, the compact material has a content of gas components including oxygen and carbon of less than 500 ppm.

13. A method according to claim 9, wherein, after said electron beam melting step, the compact material has a content of gas components including oxygen and carbon of less than 500 ppm.

14. A method according to claim 10, wherein, after said electron beam melting step, the compact material has a content of gas components including oxygen and carbon of less than 500 ppm.

15. A method according to claim 7, wherein, after said electron beam melting step, the compact material has a content of Zr of 0.5% by weight or less.

16. A method according to claim 8, wherein, after said electron beam melting step, the compact material has a content of Zr of 0.5% by weight or less.

17. A method according to claim 9, wherein, after said electron beam melting step, the compact material has a content of Zr of 0.5% by weight or less.

18. A method according to claim 10, wherein, after said electron beam melting step, the compact material has a content of Zr of 0.5% by weight or less.

19. A method according to claim 11, wherein, after said electron beam melting step, the compact material has a content of Zr of 0.5% by weight or less.

20. A method according to claim 12, wherein, after said electron beam melting step, the compact material has a content of Zr of 0.5% by weight or less.

* * * * *